United States Patent

Makino et al.

[11] Patent Number: 5,118,556
[45] Date of Patent: Jun. 2, 1992

[54] FILM MATERIAL FOR FILM CARRIER MANUFACTURE AND A METHOD FOR MANUFACTURING FILM CARRIER

[75] Inventors: Yutaka Makino, Kobe; Kazumi Ishimoto, Katano; Koichi Kumagai, Ikoma; Yasuo Izumi, both of Ikoma, all of Japan

[73] Assignee: Matsushita Electric Industrial Co., Ltd., Osaka, Japan

[21] Appl. No.: 593,020

[22] Filed: Oct. 3, 1990

[30] Foreign Application Priority Data

Oct. 3, 1989 [JP] Japan .................................. 1-259201

[51] Int. Cl.⁵ .............................................. B32B 9/00
[52] U.S. Cl. .................................... 428/209; 428/901; 228/5.1; 361/408; 361/421; 206/330; 427/96
[58] Field of Search .................. 228/5.1; 361/408, 421; 428/40, 209, 901; 29/835, 838; 206/330; 427/96

[56] References Cited

U.S. PATENT DOCUMENTS 4,380,042 4/1983 Angelucci, Jr. et al. ............. 29/838
4,826,068 5/1989 Yagoura et al. ....................... 29/835

FOREIGN PATENT DOCUMENTS 59-41845 3/1984 Japan .

Primary Examiner—Patrick J. Ryan
Attorney, Agent, or Firm—Wenderoth, Lind & Ponack

[57] ABSTRACT

A film material for the manufacture of a film carrier has a lead pattern including an outer lead portion formed independent of the electrode arrangement of a semiconductor chip to be mounted on the film carrier, and an inner lead formation portion a part of which is selectively removable in accordance with the electrode arrangement of the semiconductor chip to be mounted thereon, the inner lead formation portion being contiguous and connected to respective leads of the outer lead portion. A method for manufacturing the film carrier includes the steps of forming a conductive layer of material on a film; forming the lead pattern by etching part of the layer formed on the film into an outer lead portion having a pattern independent of the electrode arrangement of each semiconductor chip to be mounted thereon, and by leaving another part of the layer as it is to form an inner lead formation portion having a pattern which is changeable according to the electrode arrangement of the semiconductor chip to be mounted thereon; and selectively removing part of the inner lead formation portion by laser processing in accordance with the electrode arrangement of the semiconductor chip to be mounted thereon.

5 Claims, 5 Drawing Sheets

FILM MATERIAL FOR FILM CARRIER MANUFACTURE AND A METHOD FOR MANUFACTURING FILM CARRIER

BACKGROUND OF THE INVENTION

The present invention relates to a film material for film carrier manufacture and to a method for manufacturing a film carrier, and more particularly, to a film material used for manufacturing a film carrier for receiving a semiconductor chip thereon and to a method for manufacturing a film carrier using this film material.

Known methods for forming packaged semiconductor chips such as IC and LSI include a film carrier method. In this method, a conductive metal layer such as copper foil is formed on a film tape, the conductive metal layer is etched so as to form lead patterns whereby a film carrier is formed, and after connecting semiconductor chips to lead patterns on the film carrier by bonding, the film carrier is stamped and separated for each individual lead pattern so as to obtain film carrier chips each having a semiconductor chip mounted thereon.

FIGS. 4 and 5 show typical structures of the film carrier chips. First of all, FIG. 4 shows a bonding wire type of film carrier chip wherein a semiconductor chip and the lead pattern of a film carrier are connected with bonding wires. On a film 110 such as a polyimide resin film, a lead pattern 120 made of a conductive metal such as Cu is formed as a layer in a predetermined pattern. After a semiconductor chip 130 is mounted and fixed to the film 110 with solder, each electrode thereof and the lead pattern 120 are electrically connected with bonding wires 140. The peripheral portion of the semiconductor chip 130 is covered with sealing resin 150.

Next, FIG. 5 shows a bump type of film carrier chip wherein the semiconductor chip and the lead pattern of the film carrier are connected with bumps. The difference of this structure from that shown in FIG. 4 resides in that the lead pattern 120 extends to each electrode on the rear face of the semiconductor chip 130, and the lead pattern 120 and each electrode are electrically connected through bumps 170 made of Au or solder such that the semiconductor chip 130 itself is fastened to the film 110.

When these film carrier chips are compared with each other, the bonding wire type of film carrier chip has a problem in that it takes considerable labor to connect respective electrodes of the semiconductor chip 130 to the lead pattern 120 with the bonding wires 140. Further, since it is necessary to leave a sufficient distance between adjacent electrodes for performing the wire bonding operation, the distance between electrodes and the overall planar dimensions of the semiconductor chip 130 become relatively large. Furthermore, since the bonding wires 140 project from the surface of the semiconductor chip 130, the sealing resin 150 must be relatively large to completely cover the entirety of the bonding wires 140, whereby the overall dimensions of the film carrier chip are relatively large.

On the contrary, in the case of the bump type of film carrier chip, all connections can be made at one time by locating the bumps 170 between the electrodes of the semiconductor chip 130 and the lead pattern 120 and applying heat and pressure collectively, constituting an extremely efficient connecting operation. Furthermore, since the connection can be made even if the spacing between the electrodes is narrow, it is possible to have a small interelectrode electrode distance, that is, to use this technique with a small semiconductor chip 130. Since the bumps 170 are hidden below the rear surface of the semiconductor chip 130 and are thin, the bump type of film carrier chip has a relatively small thickness. As a result, it is possible to produce a film carrier chip having small overall dimensions.

For the above-mentioned reasons, the bump type of film carrier chip is considered to be superior to the wire bonding type of chip and so it is more widely used.

However, the bump type of film carrier chip has a defect in that it lacks adaptability to the electrode arrangement of the semiconductor chip 130.

Namely, the outer portion 121 of the lead pattern 120 of the film carrier chip 130 can be connected to external circuits, such as those of a printed circuit board, as is, as long as it has predetermined standard dimensions. However, since the electrode arrangements of the semiconductor chips 130 may differ, the inner portion 122 of the lead pattern 120 will have to be formed in advance in accordance with the electrode arrangement of the semiconductor chip 130, that is, the arrangement of bumps 170.

For this reason, films 110 provided with the same lead pattern 120 having an inner portion 122 of a predetermined pattern, namely, the same type of film carrier cannot be utilized for mounting semiconductor chips 130 having different electrode arrangements. And, for each different electrode arrangement of the semiconductor chips 130, it becomes necessary to manufacture a new film carrier provided with a lead pattern 120 of a different form. Furthermore, when the form of the lead pattern 120 is changed, masks and molds for etching have to be prepared for the different respective patterns, resulting in increased equipment costs, the need for retooling for each change in the pattern, and increases in production time.

Particularly, in recent years when the number of different electrode arrangements of the semiconductor chip 130 has increased and systems for producing few-of-a-kind parts have become prevalent, it has been a serious problem to provide a long lead time for the preparation of etching masks etc. according to each change in product, resulting in initial cost increases.

SUMMARY OF THE INVENTION

Accordingly, an essential object of the present invention is to provide film material of a film carrier which is used for manufacturing bump type of film carrier chips, suitable for facilitating a miniaturization of the semiconductor chips and the efficiency of the mounting operation of the chips, and which is capable of easily accommodating a change in the electrode arrangement.

Another important object of the present invention is to provide a method for manufacturing a film carrier using the film material.

In accomplishing these and other objects, according to one aspect of the present invention, there is provided a film material for the manufacture of a film carrier having a lead pattern formed by patterning a conductive metal layer on a film, the lead pattern including an outer lead portion having a pattern independent of various electrode arrangements of semiconductor chips which can be mounted on the film, and an inner lead formation portion left as is and part of which is selectively removable, in accordance with the electrode arrangement of the particular semiconductor chip to be mounted thereon, to form an inner lead portion which can be connected to the respective electrodes of the semiconductor chip.

According to another aspect of the present invention, there is provided a method for manufacturing a film carrier comprising the steps of: forming a conductive metal layer on a film; forming a lead pattern, which has an outer lead portion and an inner lead formation portion, by patterning part of the conductive metal layer formed on the film to form the outer lead portion into a pattern which is independent of electrode arrangements of various semiconductor chips which can be mounted thereon and by leaving part of the conductive metal layer as is to form the inner lead formation portion; and selectively removing part of the inner lead formation portion by laser processing in accordance with the electrode arrangement of the semiconductor chip to be mounted thereon.

In the present invention, the film material for the manufacture of film carriers is made by forming the conductive metal layer of a material such as Cu on the surface of a film tape made of polyimide, and etching the layer in a predetermined pattern so as to form the lead pattern. Such a fundamental structure is similar to that of the conventional film carrier and can be accomplished similarly.

However, in this lead pattern, the outer lead portion for connection with external circuits is formed in a conventional predetermined pattern but the inner lead portion to be connected with the electrodes of the semiconductor chip is not formed so as to leave the conductive metal layer as is. Here, the inner lead portion refers to a portion having a pattern in accordance with the electrode arrangement of the semiconductor chip to be mounted on the film carrier. That is an inner lead formation portion of the lead pattern, wherein it is necessary to change the pattern thereof in accordance with the electrode arrangement of the semiconductor chip to be mounted thereon, is formed in advance at the same time as the outer lead portion. Such a film material having a lead pattern with the above-mentioned configuration is thus fabricated in advance.

Next, the patterning of the inner lead formation portion is performed in accordance with the electrode arrangement of the semiconductor chip to be mounted thereon. The formation of the pattern of the inner lead portion is performed by laser processing. The laser can be controlled by a program set in advance in accordance with the electrode arrangement of the semiconductor chip. The concrete laser processing device and the processing conditions can be similar to those used in the conventional manufacture of semiconductor chips and wiring circuits.

Once the formation of the inner lead portion is finished, the film carrier, as is conventional in semiconductor chip mounting, is subjected to a bump formation process for forming bumps on each electrode, a connection process for connecting the lead pattern to electrodes of the semiconductor chip through the bumps, a sealing process using resins, and a stamping and separation process for forming individual film carrier chips. Thus, film carrier chips are so fabricated according to the present invention.

Since the lead pattern of the film carrier is made up of two portions, namely, the outer lead portion wherein no change in pattern is required to accommodate for the electrode arrangement of the semiconductor chip to be mounted thereon and the inner lead formation portion wherein a change in the pattern is required to conform to the electrode arrangement of the particular semiconductor chip to be mounted thereon, the film material can be efficiently mass produced irrespective of the electrode arrangement of the semiconductor chip. Further, since a selective part of the inner lead formation portion is removed by laser processing wherein various patterns can be easily produced, it is possible to easily cope with changes in the electrode arrangement of the semiconductor chips without lowering the manufacturing productivity of film carriers, thereby providing an extremely flexible manufacturing method.

BRIEF DESCRIPTION OF THE DRAWINGS

These and other objects and features of the present invention will become clear from the following description taken in conjunction with the preferred embodiments thereof with reference to the accompanying drawings, in which:

FIGS. 4a and 4b show a conventional bonding wire type of film chip, wherein FIG. 4a is a sectional view and FIG. 4b is a bottom plan view showing the sealing resin in phantom; and FIGS. 5a and 5b show a conventional bump type of film carrier, wherein FIG. 5a is a sectional view and FIG. 5b is a bottom plan view showing the sealing resin in phantom.

DETAILED DESCRIPTION OF THE PREFERRED EMBODIMENTS

Figure 1:
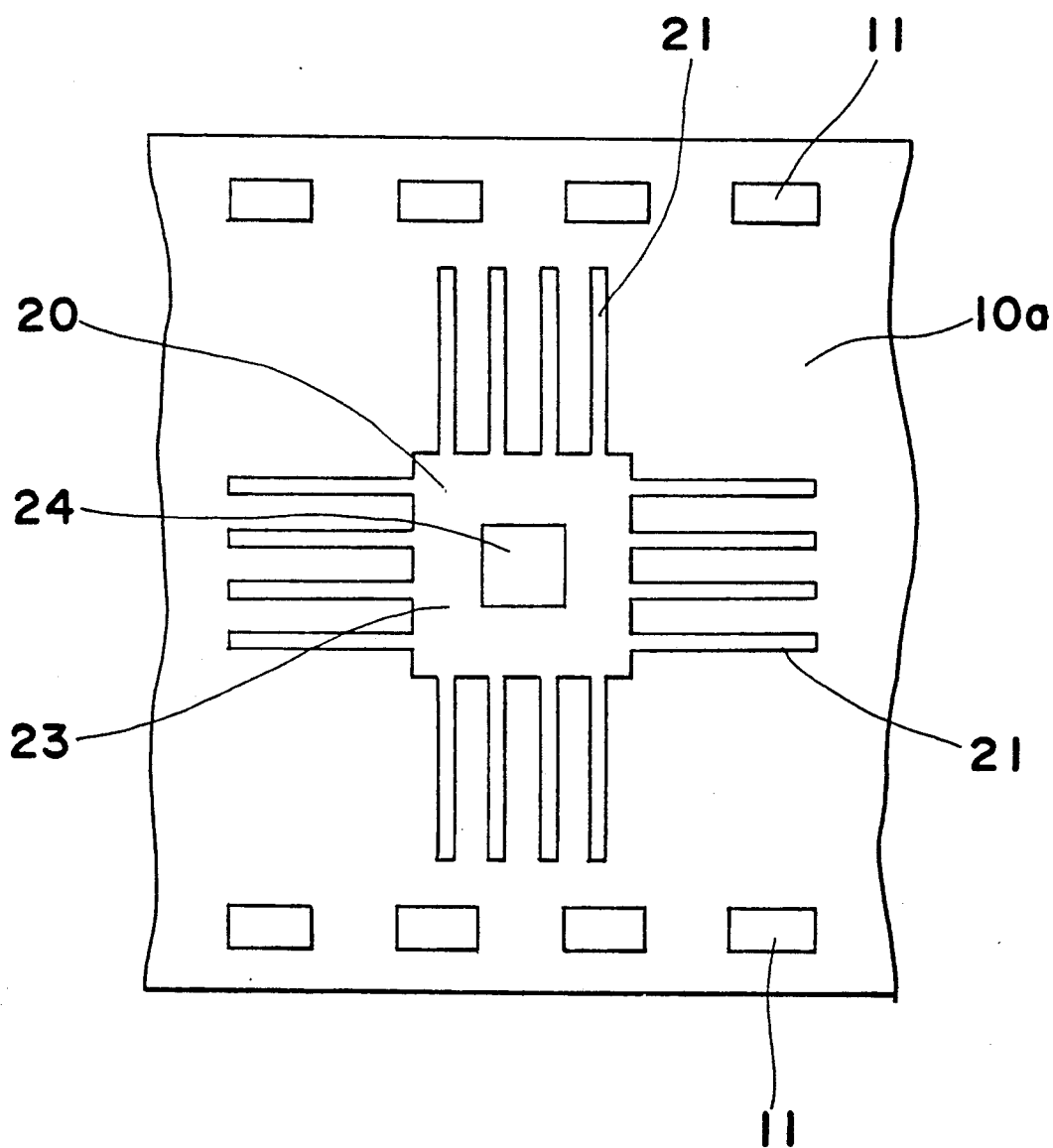
FIG. 1 is a plan view of a preferred embodiment of film material before the inner lead portion is formed according to the present invention.

Before the description of the present invention proceeds, it is to be noted that like parts are designated by like reference numerals throughout the accompanying drawings.

FIG. 1 shows a film tape 10a for the manufacture of film carriers. On the long film tape 10a, sprocket holes 11 are formed by stamping the tape at predetermined distances along both sides thereof.

On the central surface portion of the film tape 10a, there is formed a lead pattern 20 to which a semiconductor chip 30 is mounted. The lead pattern 20 is obtained by forming a conductive metal layer of Cu, etc. over the entire surface of the film tape 10a and etching the layer so as to form a predetermined pattern. The lead pattern 20 is comprised of an outer lead portion 21 extending in four directions and a square inner lead formation portion 23 located in the center of the outer lead portion 21. The structure of the outer lead portion 21 is the same as that of a conventional common film carrier. The inner lead formation portion 23 is not formed with respective patterns for individual electrodes but has an integrated contiguous form. Namely, the inner lead formation portion 23 covers all locations where respective inner lead portions may be arranged in the case of any electrode arrangement of the semiconductor chip 30. At the center of the inner lead formation portion 23, there is formed a small square vacant space 24. The reason for this is that in a usual semiconductor chip 30, the electrodes are located on the periphery of a rectangle, and are hardly ever located at the central portion of the chip. Therefore, the inner lead formation portion 23 does not have to be formed at the central portion of the lead pattern 20. If a vacant space 24 is left in advance at the central portion of the lead pattern 20, the labor for forming the inner lead portion from the inner lead formation portion 23 can be reduced.

The film tape 10a is manufactured in such a state described above and is transported and stored or offered for sale.

Figure 2A:
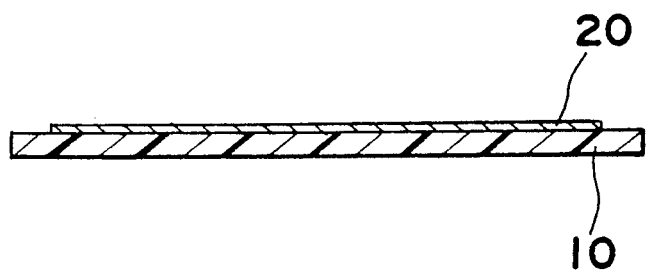
FIGS. 2a to 2c are sectional schematic views showing sequential processes for manufacturing a film carrier.

FIG. 2 shows schematically the process for mounting the semiconductor chip 30 onto film material such as the film tape 10a. First of all, as shown in FIG. 2a, a lead portion 20 made of a conductive metal is formed as a layer on the surface of a film 10. This state is shown in FIG. 1.

Figure 2B:
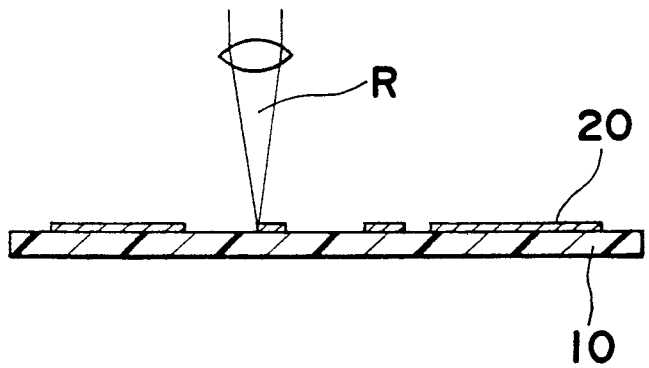
Figure 3:
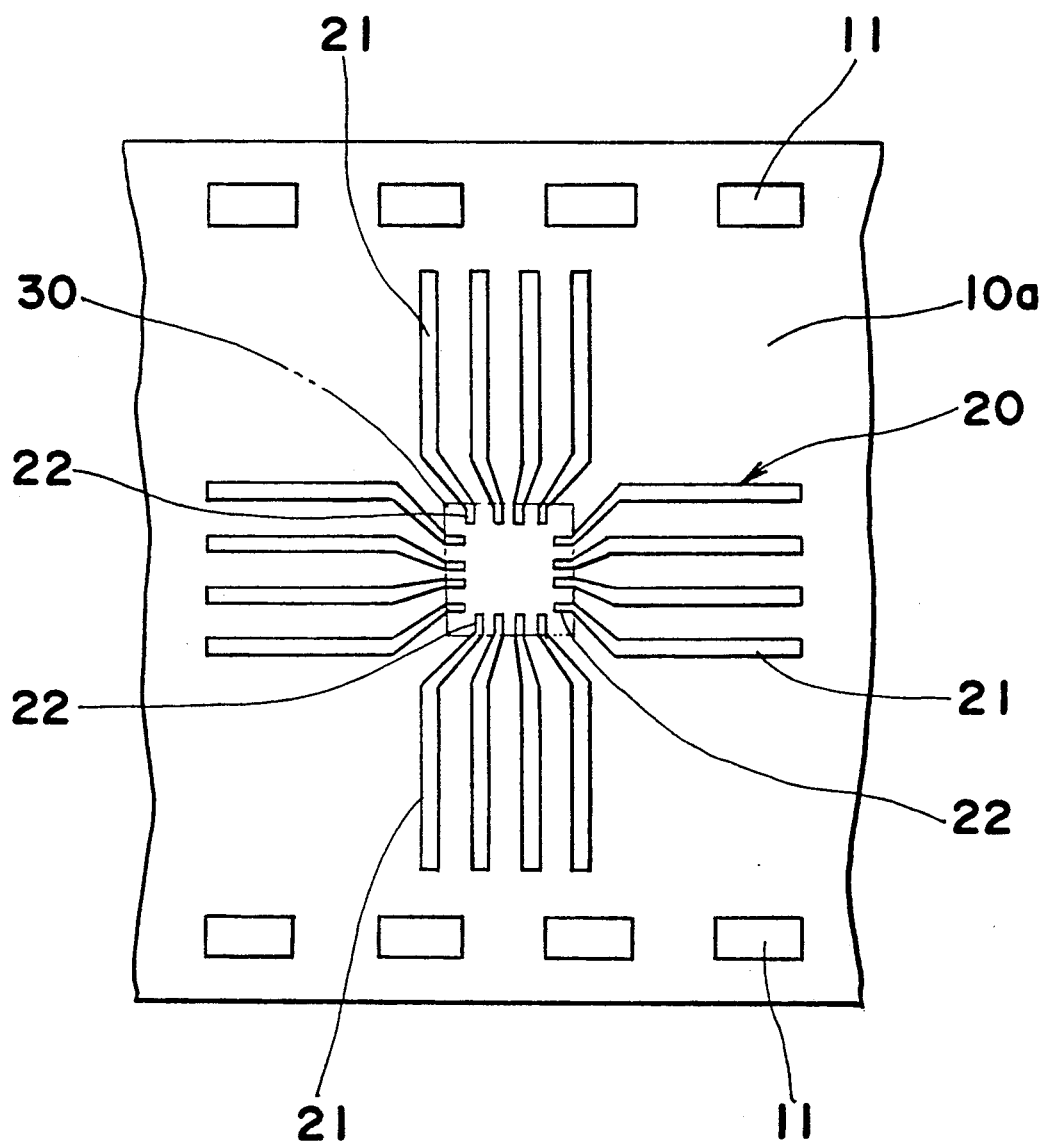
FIG. 3 is a plan view of a film carrier wherein the inner lead portion has been formed.
Figure 4A:
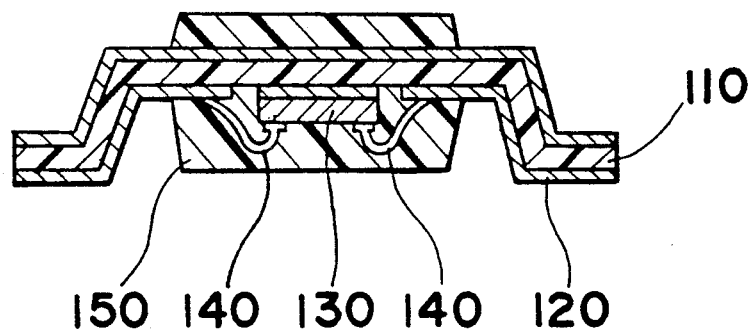
Figure 4B:
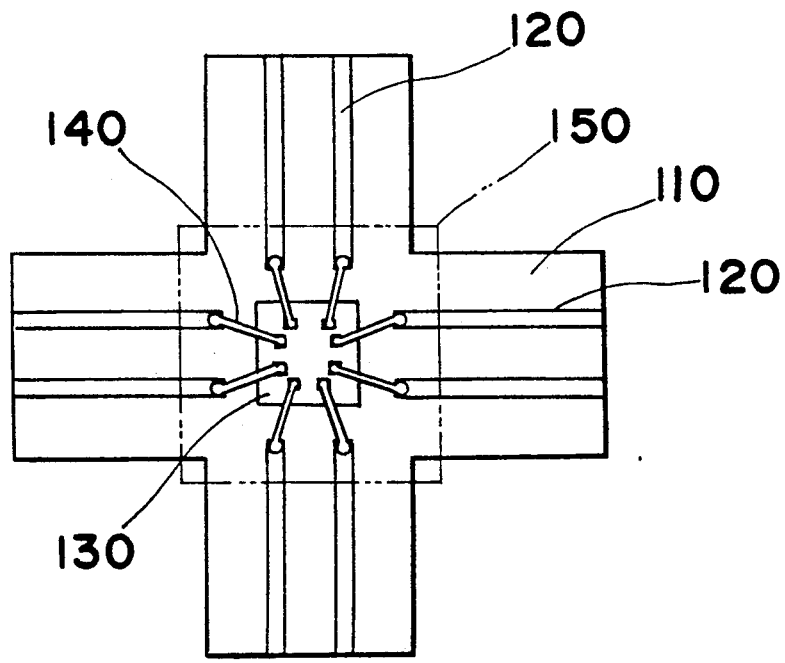
Figure 5A:
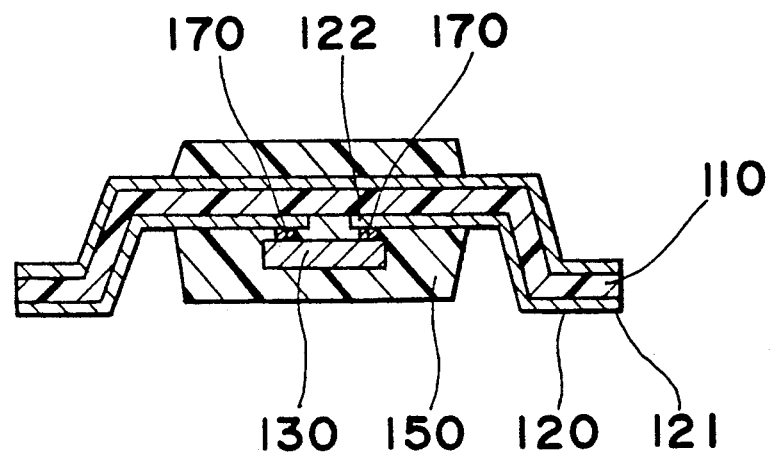
Figure 5B:
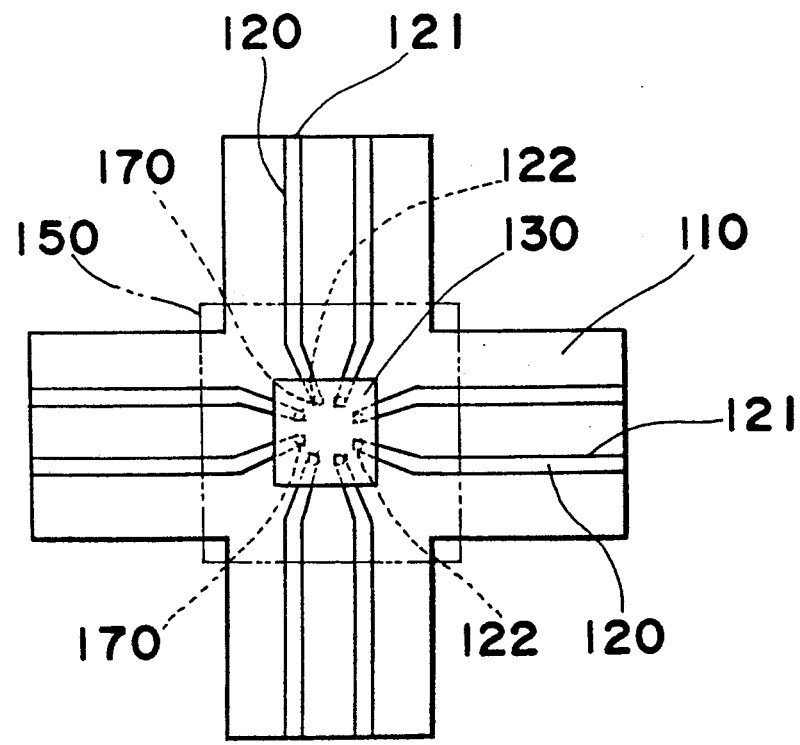

Next, in accordance with the electrode arrangement of the semiconductor chip 30 to be mounted, the inner lead portion 22 of the lead pattern 20 is formed. As shown in FIG. 2b, by irradiating the lead pattern 20 with a laser beam R emitted from above the lead pattern 20, a portion of the conductive metal layer constituting the inner lead formation portion 23 is eliminated. By controlling the irradiation pattern of laser beam R, an inner lead portion 22 with a required pattern can be formed. FIG. 3 shows the structure of the inner lead portion 22 created in this manner. Respective outer leads of the outer lead portion 21 having a relatively wide spacing therebetween are contiguous to narrow wedge-shaped inner leads of the inner lead portion 22, respectively. The respective tip ends of the inner leads extend to the respective electrodes on the lower surface of the semiconductor chip 30. In the manner as described above, a film carrier having any lead pattern can be manufactured.

Figure 2C:
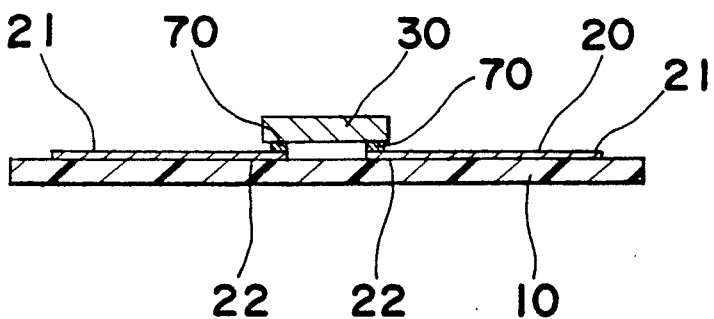

FIG. 2c shows a state wherein the semiconductor chip 30 is mounted on the film carrier. By mounting the semiconductor chip 30 on the inner lead portion 22 through bumps 70 and applying heat and pressure thereon, respective electrodes of the semiconductor chip 30 and respective leads of the inner lead portion 22 are connected and fastened to each other. The specific means and process by which the bump connection is performed are the same as those used in the manufacture of conventional bump type of carrier chips.

Thereafter, the portion at which the semiconductor chip 30 is mounted to the film carrier is sealed with resin, the lead pattern 20 is separated form the film tape 10a at the outer peripheral portion of the lead pattern 20 by stamping, and the outer lead portion 21 of the lead pattern 20 is bent for easy connection with external circuits in a manner similar to the method for manufacturing a conventional film carrier.

In the above-described film material for the manufacture of film carriers and the method for manufacturing film carriers according to the present invention, since the film material as raw material for film carriers is not formed with the inner lead portion to be connected to bumps of the chip, and has a pattern which must be changed for each change in the electrode arrangement of the semiconductor chip, it is possible to apply in common all of the manufacturing processes, exclusive of that for forming the inner lead portion, to various semiconductor chips having different electrode arrangements. Therefore, one kind of manufacturing equipment is enough for the manufacture of masks or molds for etching, and the time and labor involved in changing etching masks for each change in the electrode arrangement of the semiconductor chip can be saved, resulting in a remarkable cost reduction. Therefore, the present invention has a great effect on the improvement of productivity and the reduction in the manufacturing costs associated with semiconductor chip packages.

The formation of the inner lead portion is performed by laser processing in accordance with the electrode arrangement of the semiconductor chip. Since a desired processing pattern can be obtained through the NC programming of the laser, it is possible to easily and rapidly accommodate for semiconductor chips having various electrode arrangements only by changing the processing program so as to suit the particular electrode arrangement in question. Therefore, the present invention provides an extremely flexible manufacturing method. Furthermore, since only the inner lead formation portion of a small area must be laser processed, the entire processing time and labor is not increased and the productivity and economy as a whole are not impaired.

Accordingly, it becomes possible to manufacture a film carrier which contributes to the increased electrode arrangement density and miniaturization of the bump type of semiconductor chip package and which has a flexibility equal to or larger than that of a bonding wire type of film carrier, contributing greatly to the demands for film carrier chips.

Although the present invention has been fully described in connection with the preferred embodiments thereof with reference to the accompanying drawings, it is to be noted that various changes and modifications will become apparent to those skilled in the art. Such changes and modifications are to be understood as included within the scope of the present invention as defined by the appended claims unless they otherwise depart therefrom.

What is claimed is:

1. Film material for the manufacture of a film carrier of a semiconductor chip package, said film material comprising:

a film; and a layer of electrically conductive material disposed on said film;

said layer of electrically conductive material including at least one discrete lead pattern, said lead pattern including an outer lead portion of a plurality of strip-shaped leads, and a contiguous inner lead formation portion connecting the strip-shaped leads to one another at respective ends thereof, whereby part of said inner lead formation pattern can be selectively removed to separate the strip shaped leads from one another and form an inner lead portion constituted by terminal ends of the separated leads arranged at selected locations which correspond to one of various electrode arrangements of a semiconductor chip to be mounted thereto.

2. Film material for the manufacture of a film carrier of a semiconductor chip package as claimed in claim 1 wherein said inner lead formation pattern has a rectangular shape, and the strip-shaped leads of said outer lead portion extend from each of the sides of said inner lead formation pattern, respectively, so as to extend in four directions.

3. Film material for the manufacture of a film carrier of a semiconductor chip package as claimed in claim 2 wherein said inner lead formation pattern defines a space at the center thereof which is free of said electrically conductive material.

4. A method for manufacturing a film carrier of a semiconductor chip package, said method comprising:

providing film material including a film tape having a lead pattern of electrically conductive material disposed thereon, the pattern including an outer lead portion formed of a plurality of strip-shaped leads, and a contiguous inner lead formation portion connecting the strip shaped leads to one another at respective ends thereof; and selectively removing a part of the inner lead formation portion with a laser to separate the strip-shaped leads from one another and form an inner lead portion constituted by terminal ends of the separated leads arranged at selected locations which correspond to an electrode arrangement of a semiconductor chip to be mounted thereto.

5. A method as claimed in claim 4, wherein said providing a film tape comprises forming a layer of the electrically conductive material on the film tape, and etching part of said layer into the outer lead portion of said lead pattern while leaving another portion of said layer as it is so as to constitute the inner lead formation portion of the lead pattern.

* * * * *